(12) United States Patent
Lee et al.

(10) Patent No.: US 9,532,441 B2
(45) Date of Patent: Dec. 27, 2016

(54) BOARD ASSEMBLY FOR TRANSMITTING HIGH-SPEED SIGNAL AND METHOD OF MANUFACTURING THE SAME

(71) Applicant: ELECTRONICS AND TELECOMMUNICATIONS RESEARCH INSTITUTE, Daejeon-si (KR)

(72) Inventors: Jyung Chan Lee, Daejeon-si (KR); Eun Gu Lee, Daejeon-si (KR); Sil Gu Mun, Daejeon-si (KR); Sang Soo Lee, Daejeon-si (KR)

(73) Assignee: ELECTRONICS AND TELECOMMUNICATIONS RESEARCH INSTITUTE, Daejeon-si (KR)

( * ) Notice: Subject to any disclaimer, the term of this patent is extended or adjusted under 35 U.S.C. 154(b) by 14 days.

(21) Appl. No.: 14/619,521

(22) Filed: Feb. 11, 2015

(65) Prior Publication Data

US 2015/0230330 A1    Aug. 13, 2015

(30) Foreign Application Priority Data

Feb. 12, 2014    (KR) .......................... 10-2014-0016183

(51) Int. Cl.
*H05K 1/02*    (2006.01)
*H05K 3/36*    (2006.01)
*H01P 5/02*    (2006.01)

(52) U.S. Cl.
CPC ............. *H05K 1/0219* (2013.01); *H01P 5/028* (2013.01); *H05K 1/025* (2013.01);
(Continued)

(58) Field of Classification Search
CPC ................................ H05K 1/0242; H05K 3/36
(Continued)

(56) References Cited

U.S. PATENT DOCUMENTS 6,292,073 B1 *  9/2001  Egolf ..................... H01P 1/047
                                                     333/260
6,590,478 B2 *  7/2003  Pluymers ............... H01P 1/047
                                                     333/246

(Continued)

OTHER PUBLICATIONS

Sae-Kyoung Kang, et al; "A Cost-effective and Compact 28-Gb/s ROSA Module using a Novel TO-CAN Package", Published in: Electronic Components and Technology Conference (ECTC), 2012 IEEE 62nd; May 29, 2012-Jun. 1, 2012; pp. 1992-1996.

*Primary Examiner* — Timothy Thompson
*Assistant Examiner* — Charles Pizzuto
(74) *Attorney, Agent, or Firm* — Ladas & Parry LLP

(57) ABSTRACT

A board assembly for transmitting a high-speed signal and a method of manufacturing the same. The board assembly may include a submount board, a base board, and a contact member for a signal line. The submount board may include at least one first high-speed signal line formed on the surface thereof. The base board may include the submount board on one part of the upper surface thereof, and at least second high-speed signal line on the other part of the upper surface thereof, wherein the second high-speed signal lines corresponds to the first high-speed signal lines, respectively. The contact member for the signal line may be installed on the side of the submount board, and have an upper portion contacting the first high-speed signal line and a lower portion contacting the second high-speed signal line such that the first high-speed signal line contacts the second high-speed signal line.

12 Claims, 10 Drawing Sheets

(52) U.S. Cl.
CPC ........... *H05K 2201/0919* (2013.01); *H05K 2201/09727* (2013.01); *H05K 2201/09845* (2013.01); *H05K 2201/10242* (2013.01); *Y10T 29/49126* (2015.01)

(58) Field of Classification Search
USPC ............................................ 174/261; 29/830
See application file for complete search history.

(56) References Cited

U.S. PATENT DOCUMENTS

| | | | |
|---|---|---|---|
| 6,601,295 B2 * | 8/2003 | Maekawa | H01L 23/3121 257/E23.061 |
| 7,405,363 B2 * | 7/2008 | Inoue | H05K 1/117 174/255 |
| 7,439,449 B1 * | 10/2008 | Kumar | G02B 6/4292 174/254 |
| 2008/0191818 A1 | 8/2008 | Lee et al. | |
| 2012/0235764 A1 | 9/2012 | Kang et al. | |

\* cited by examiner

BOARD ASSEMBLY FOR TRANSMITTING HIGH-SPEED SIGNAL AND METHOD OF MANUFACTURING THE SAME

CROSS-REFERENCE TO RELATED APPLICATION(S)

This application claims the benefit under 35 U.S.C. §119 (a) of Korean Patent Application No. 10-2014-0016183, filed on Feb. 12, 2014, in the Korean Intellectual Property Office, the entire disclosure of which is incorporated herein by reference for all purposes.

BACKGROUND

1. Field

The following description relates to a board assembly for transmitting a high-speed signal and a method of manufacturing the same.

2. Description of the Related Art

The technology of electronic devices is facing the need to make the devices faster, lighter, and more integrated due to the wide use of personal computers, dissemination of Long-Term Evolution-Advanced (LTE-A) personal cellular phones, high-speed transmission networks for multimedia services, the expansion of an optical subscriber network, the storage of large data, and an emphasis on the importance of a backup device.

Generally, electronic devices are formed in a structure in which numerous integrated circuit elements are connected on a printed circuit board (PCB). In a case of low-speed circuits, an important factor to determine the operation speed is the delay time for each element. However, in a case of high-speed circuits, the important factor to determine the operation speed is a signal transmission path, i.e., the signal line on the PCB.

Regarding an interface for transmitting such a high-speed signal, the importance on the connection and structure of the signal lines is emphasized when connecting the PCBs of different types and structuring numerous signal lines for the high-speed signal transmission. In connecting the PCBs of different types and structuring the signal lines, the following problems occur. First, one problem is that the high-speed signal transmission characteristics decrease due to the structure differences of the signal lines, which are caused by the connection between the PCBs of different types. Second, another one is that the size of the element package is changed due to the numerous signal lines for the high-speed signal transmission.

Wire-bonding may be used when connecting the PCBs of different types and when structuring numerous signal lines for high-speed signal transmission so as to make the devices in the high-speed device technology faster, lighter, and more integrated. However, the wire-bonding manner has problems of the incurred cost, the characteristics irregularity between the numerous signal lines, the simple removal, and the damage of the wire-bonding happened when the outermost region of the element package is used.

Accordingly, the problems, which occur when connecting the PCBs of different types and when structuring numerous signal lines for the high-speed signal transmission, need to be solved for making the devices in the high-speed device technology faster, lighter, and more integrated.

SUMMARY

The following description relates to a board assembly for transmitting a high-speed signal so as to improve high-speed signal transmission characteristics and a method of manufacturing the same.

In one general aspect, so as to achieve such a goal, a board assembly for transmitting a high-speed signal includes a submount board, a base board, and a contact member for a signal line. The submount board has at least one first high-speed signal line formed on an upper surface thereof. The base board has the submount board installed on one part of an upper surface thereof and at least one second high-speed signal line on the other part of the upper surface thereof, wherein each of the at least one second high-speed signal line corresponds to each of the at least one first high-speed signal line. The contact member for a signal line, which is installed on a side of the submount board and has an upper portion contacting the at least one first high-speed signal line and a lower portion contacting the at least one second high-speed signal line such that the at least one first high-speed signal line contacts the at least one second high-speed signal line.

In another general aspect, a method of manufacturing a board assembly for transmitting a high-speed signal includes preparing a submount board having at least one first high-speed signal line formed on an upper surface thereof. The method includes forming at least one first semicircular groove corresponding to the at least one first high-speed signal line on a side of the submount board. The method includes preparing a contact member for a signal line, which is formed in a shape of a semicircular column being inserted into the at least one first semicircle groove. The method includes inserting and fixing the contact member for a signal line to the first semicircular groove in such a manner that an upper portion of the contact member contacts the at least one first high-speed signal line. The method includes preparing a base board having at least one second high-speed signal line on a part of an upper surface of the base board, wherein each of the at least one second high-speed signal line corresponds to each of the at least one first high-speed signal line. The method includes fixing the submount board to the upper surface of the base board in such a manner that a lower portion of the contact member for a signal line contacts an end of the at least one second high-speed signal line.

Other features and aspects may be apparent from the following detailed description, the drawings, and the claims.

Figure 1:
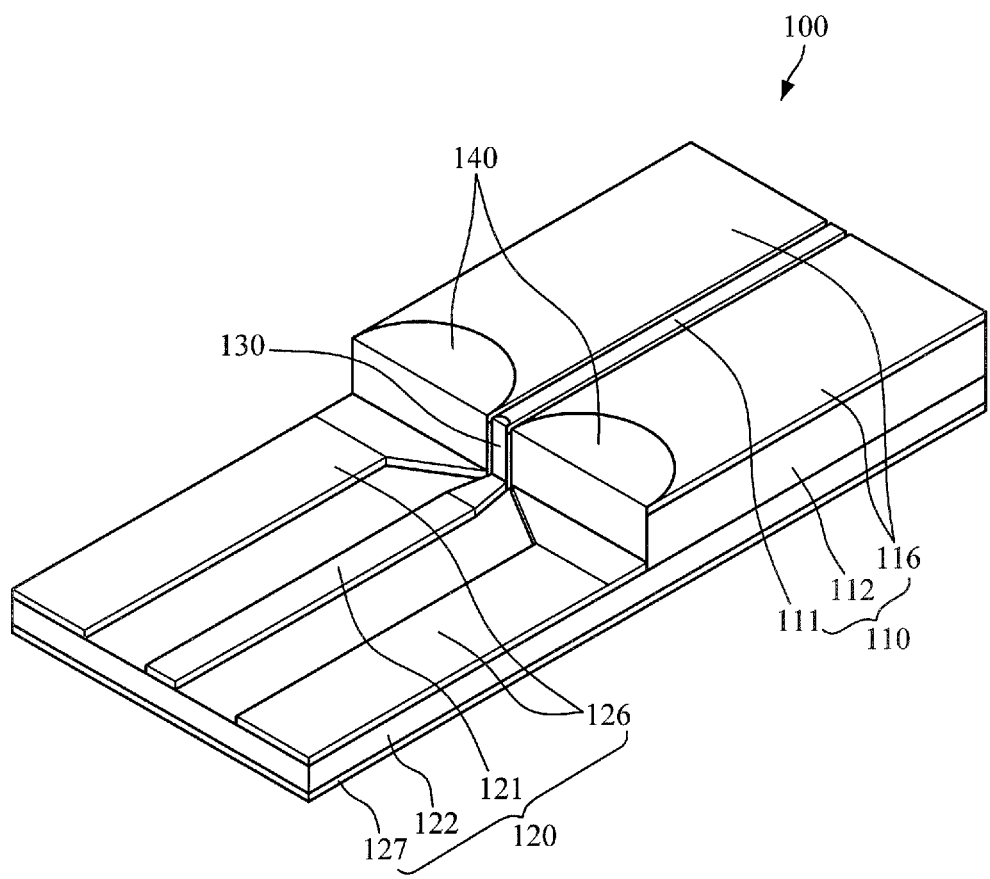
FIG. 1 is a perspective view illustrating an example of a board assembly for transmitting a high-speed signal.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 2:
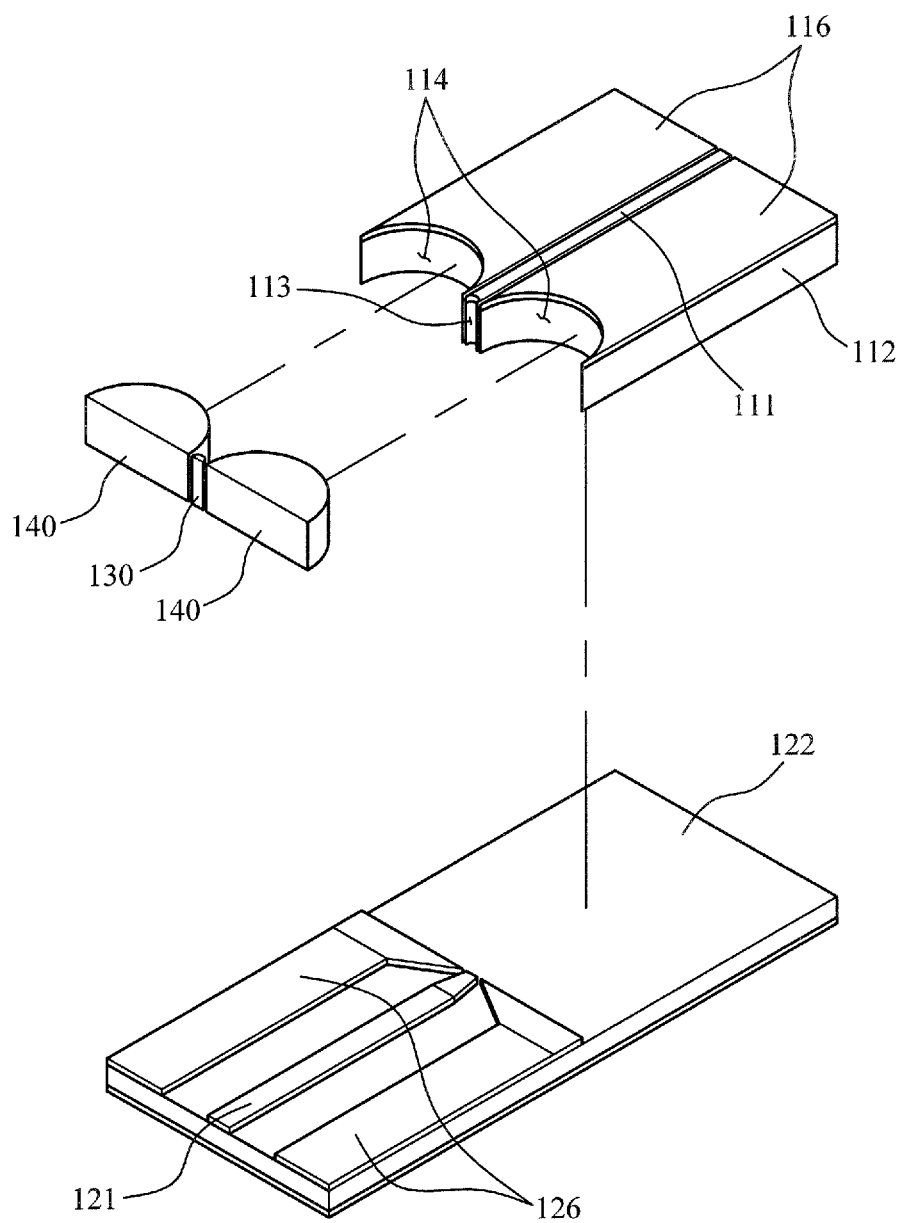
FIG. 2 is an exploded perspective view of FIG. 1.

FIG. 1 is a perspective view illustrating an example of a board assembly for transmitting a high-speed signal. FIG. 2 is an exploded perspective view of FIG. 1.

Referring to FIGS. 1 and 2, a board assembly 100 for transmitting a high-speed signal includes a submount board 110, a base board 120, and a contact member 130 for the signal line.

The submount board 110 includes, on the upper surface, at least one first high-speed signal line 111 for transmitting a high-speed signal. For example, the submount board 110 may include a first dielectric member 112. The first dielectric member 112 may be formed in a shape of a rectangular plate. The first high-speed signal line 111 may be formed to be of a uniform width and thickness on the upper surface of the first dielectric member 112. The first high-speed signal line 111 may be made of a conductive metallic material, such as copper. Optical-electrical elements, such as a light emitting element or a photodetector, may be mounted on the submount board 110. The first high-speed signal line 111 may be electrically connected to the optical-electrical elements.

A first semicircular groove 113 may be formed on one side of the submount board 110. The first semicircular groove 113 may be cut to have a cross-sectional surface of a semicircular shape from one end of the upper surface of the first high-speed signal line 111 to the lower surface of the first dielectric member 112. The first semicircular groove 113 may have the same diameter as the width of the first high-speed signal line 111.

The submount board 110 is mounted on one part of the upper surface of the base board 120, and a second high-speed signal line 121 is formed on the other part of the upper surface of the base board 120 so as to correspond to the first high-speed signal line 111. The second high-speed signal line 121 is provided for transmitting a high-speed signal in the same way as the first high-speed signal line 111. For example, the base board 120 may include a second dielectric member 122. The second dielectric member 122 may be formed in a shape of a rectangular plate, and may be longer than the first dielectric member 112. The first dielectric member 112 is mounted on one part of the upper surface of the second dielectric member 122, and the second high-speed signal line 121 is formed on the other part of the upper surface of the second dielectric member 122. In a case of the second high-speed signal line 121 which has the different width from the one of the first high-speed signal line 111, the second high-speed signal line 121 may be formed to be of a uniform width and thickness, excluding its end part facing the submount board 110. The second high-speed signal line 121 may be made of a conductive metallic material.

The contact member 130 for the signal line is mounted on one side of the submount board 110, and the upper portion of the contact member 130 for the signal line contacts the first high-speed signal line 111 and the lower portion thereof contacts the second high-speed signal line 121. Thus, the first high-speed signal line 111 and the second high-speed signal line 121 contact each other. For example, the contact member 130 for the signal line may be inserted into the first semicircular groove 113 and formed in a shape of a semicircular column with conductivity. As the contact member 130 for the signal line is inserted and fixed to the first semicircular groove 113, the upper portion of the contact member 130 for the signal line contacts the first high-speed signal line 111, and lower portion thereof contacts the second high-speed signal line 121. Accordingly, since the first high-speed signal line 111 contacts the second high-speed signal line 121 by the contact member 130 for the signal line, the optical-electrical element mounted on the submount board 110 may be electrically connected to the second high-speed signal line 121. The contact member 130 for the signal line may be fixed to the inner wall of the first semicircular groove 113 using a conductive adhesive, such as silver epoxy, etc.

Having the same width as the contact member 130 for the signal line, each of the first and second high-speed signal lines 111 and 121 may contact the contact member 130 for the signal line. The first high-speed signal line 111 has the same width as the diameter of the contact member 130 for the signal line. In a case of the second high-speed signal line 121 of the wider width than the one of the first high-speed signal line 111, the second high-speed signal line 121 may have one end part becoming narrow to form the same width as the diameter of the contact member 130 for the signal line.

The submount board 110 may include at least one first ground line 116 for grounding on the upper surface thereof. The first ground line 116 may be two in number, and each of them may be disposed on both sides of one first high-speed signal line 111. The first ground lines 116 may be disposed side by side with the first high-speed signal line 111, keeping a regular distance. The first ground lines 116 may be made of a conductive metallic material to be of a predetermined width and thickness and formed on the upper surface of the first dielectric member 112.

The base board 120 may have, on the upper surface thereof, second ground lines 126 that correspond to the first ground lines 116. The second ground lines 126 are provided for grounding in the same way as the first ground lines 116. In a case of two first ground lines 116, the second ground lines 126 may be two in number, and each of them may be disposed on both sides of one second high-speed signal line 121. The second ground wires 126 may be disposed side by side with the second high-speed signal line 121, keeping a regular distance. In a case of the second ground line 126 with the different width from the one of the first ground line 116, the second ground line 126 may be formed to be of a uniform width and thickness, excluding its end part facing the submount board 110. The second ground line 126 may be made of a conductive metallic material on the upper surface of the second dielectric member 122. A ground layer 127 may be formed on the lower surface of the second dielectric member 122. The ground layer 127 may be made of a conductive metallic material and contact the second ground line 126 through a via, etc.

The first ground line 116 and the second ground line 126 may contact each other by a contact member 140 for the ground line. The contact member 140 for the ground line may be mounted on a side of the submount board 110, and the upper portion of the contact member 140 for the ground line may contact the first ground line 116 and the lower portion thereof may contact the second ground line 126. Thus, the first ground line 116 and the second ground line 126 may contact each other. For example, a second semicircular groove 114 may be formed on the side of the submount board 110. The second semicircular groove 114 may be cut to have a cross-sectional surface of a semicircular shape from one end of the upper surface of the first ground line 116 to the lower surface of the first dielectric member 112. The second semicircular groove 114 may have the same diameter as the width of the first ground line 116.

The contact member 140 for the ground line may be inserted into the second semicircular groove 114 and formed in a shape of a semicircular column with conductivity. The contact member 140 for the ground line may be made of a conductive metallic material. As the contact member 140 for the ground line is inserted and fixed to the second semicircular groove 114, the upper portion of the contact member 140 for the ground line contacts the first ground line 116, and the lower portion thereof contacts the second ground line 126. Accordingly, the first ground line 116 may contact the second ground line 126 by the contact member 140 for the ground line. The contact member 140 for the ground line may be fixed to the inner wall of the second semicircular groove 114 using a conductive adhesive.

Having the same width as the contact member 140 for the ground line, each of the first and second ground lines 116 and 126 may contact the contact member 140 for the ground line. The first ground line 116 has the same width as the diameter of the contact member 140 for the ground line. In a case of the second ground line 126 of the narrower width than the one of the first ground line 116, the second ground line 126 may have one end part becoming wide to form the same width as the diameter of the contact member 140 for the ground line.

The above-mentioned method of manufacturing a board assembly for transmitting a high-speed signal is described below with reference to FIGS. 3 to 7.

Figure 3:
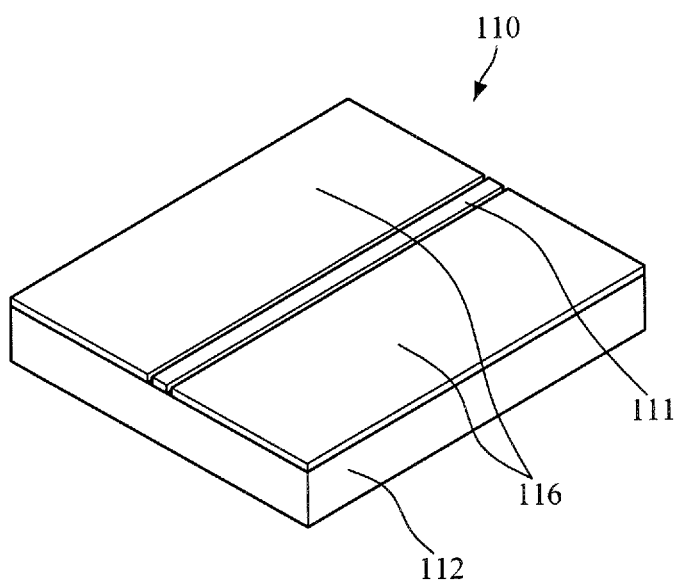
FIGS. 3 to 7 are diagrams illustrating an example of a method of manufacturing a board assembly according to the example illustrated in FIG. 1.

First, as illustrated in FIG. 3, a submount board 110 is prepared. The submount board 110 may include at least one first high-speed signal line 111 formed on the upper surface of a first dielectric member 112. On the upper surface of the first dielectric member 112, the submount board 110 may have first ground lines 116, each of which is disposed on both sides of one first high-speed signal line 111.

Figure 4:
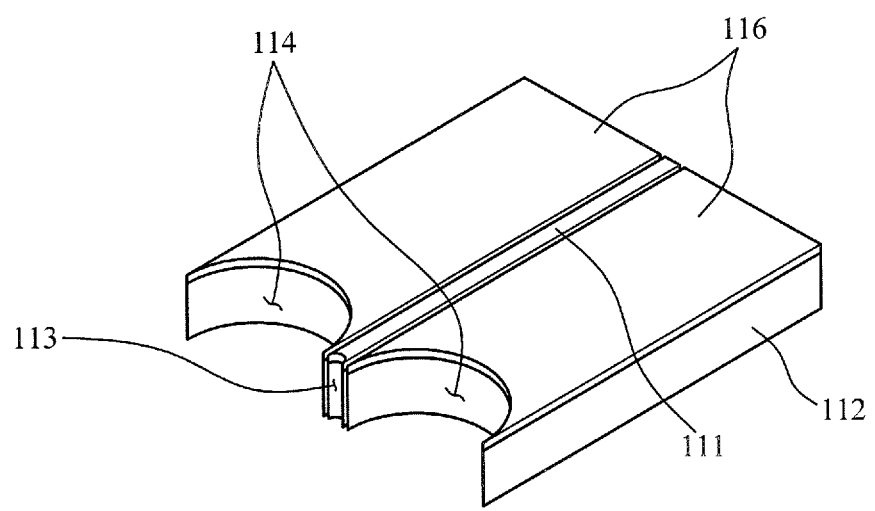
Figure 5:
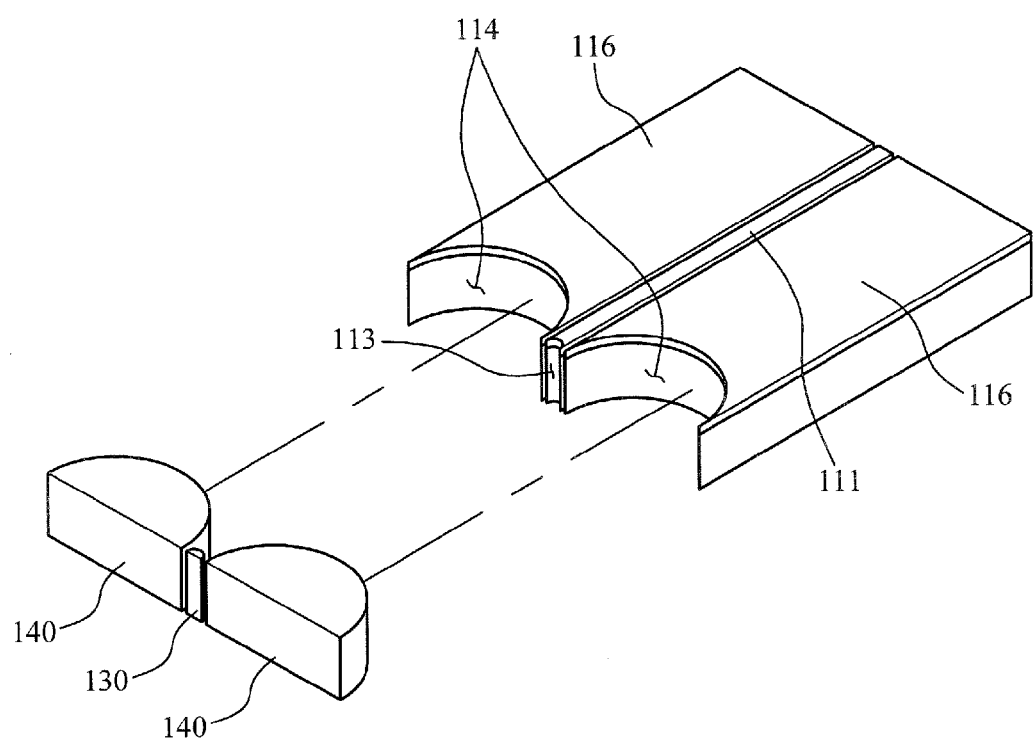

As illustrated in FIG. 4, a first semicircular groove 113 corresponding to the first high-speed signal line 111 is formed on one side of the submount board 110. Second semicircular grooves 114 are formed on one side of the submount board 110 so as to correspond, respectively, to the first ground lines 116. As illustrated in FIG. 5, a contact member 130 is prepared, which is formed in a shape of a semicircular column, with conductivity, to be inserted into the first semicircular groove 113. In addition, contact members 140 for the ground line are prepared, each of which is formed in a shape of a semicircular column with conductivity such that the contact members 140 for the ground line are inserted into each of the semicircular grooves 114.

Figure 6:
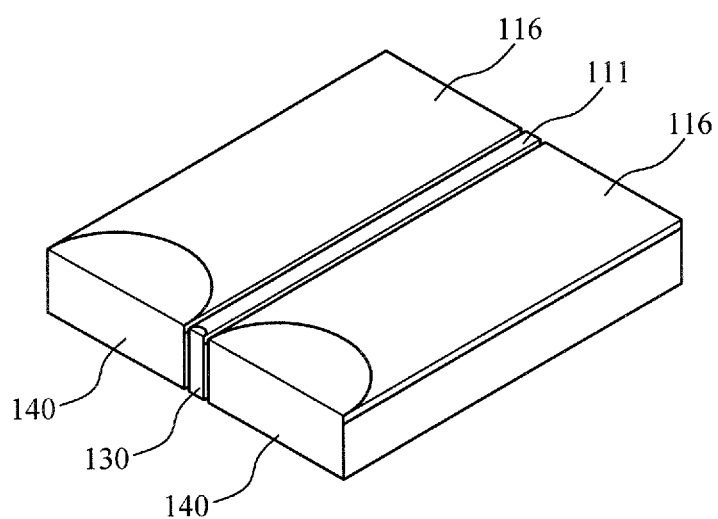

As illustrated in FIG. 6, the contact member 130 for the signal line is inserted and fixed to the first semicircular groove 113 such that the upper portion of the contact member 130 for the signal line contacts the first high-speed signal line 111. The contact members 140 for the ground line are, respectively, inserted and fixed into the second semicircular grooves 114 so that the contact members 140 contact the first ground lines 116, respectively. Here, the contact member 130 for the signal line may be fixed to the inner wall of the first semicircular groove 113 using a conductive adhesive. In addition, each of the contact members 140 for the ground line may be, respectively, fixed to the inner walls of the second circular grooves 114 using a conductive adhesive.

Figure 7:
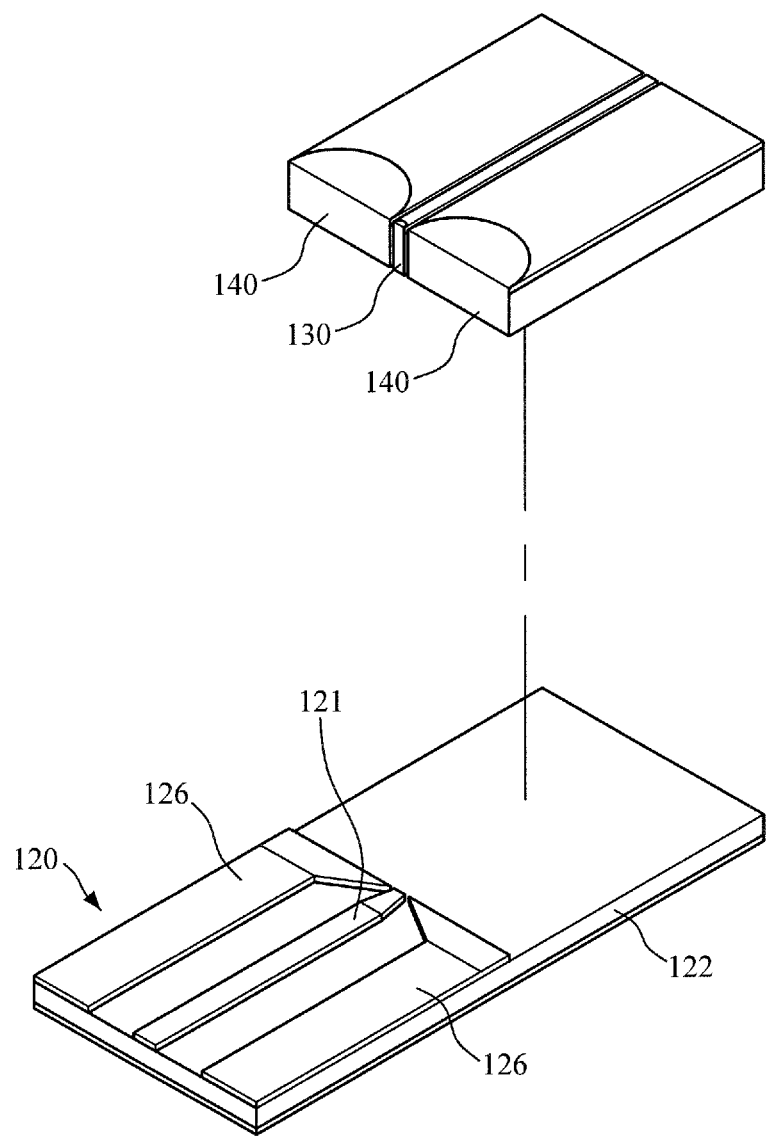

As illustrated in FIG. 7, a base board 120 is prepared. The base board 120 may have the second high-speed signal line 121 on one part of the upper surface of the second dielectric member 122 such that the second high-speed signal line 121 corresponds to the first high-speed signal line 111. On the upper surface of the second dielectric member 122, the base board 120 may have second ground lines 126, each of which is disposed on both sides of one second high-speed signal line 121.

The submount board 110 is fixed to the upper surface 120 of the base board 120 in such a manner that the lower portion of the contact member 130 fixed to the submount board 110 contacts the end of the second high-speed signal line 121 and each of the lower portions of the contact members 140 contacts each of the ends of the second ground lines 126. Here, the submount board 110 may be fixed to the base board 120 using a conductive adhesive. Thus, the board assembly 100 for transmitting a high-speed signal illustrated in FIG. 1 may be manufactured. As contacting the second high-speed signal line 121 by the contact member 130 for the signal line, the first high-speed signal line 111 may be used in transmitting the high-speed signal in the board assembly 100 for transmitting a high-speed signal. In addition, the first ground lines 116 may contact, respectively, the second ground lines 126 by each of the contact members 140 for the ground line.

Figure 8:
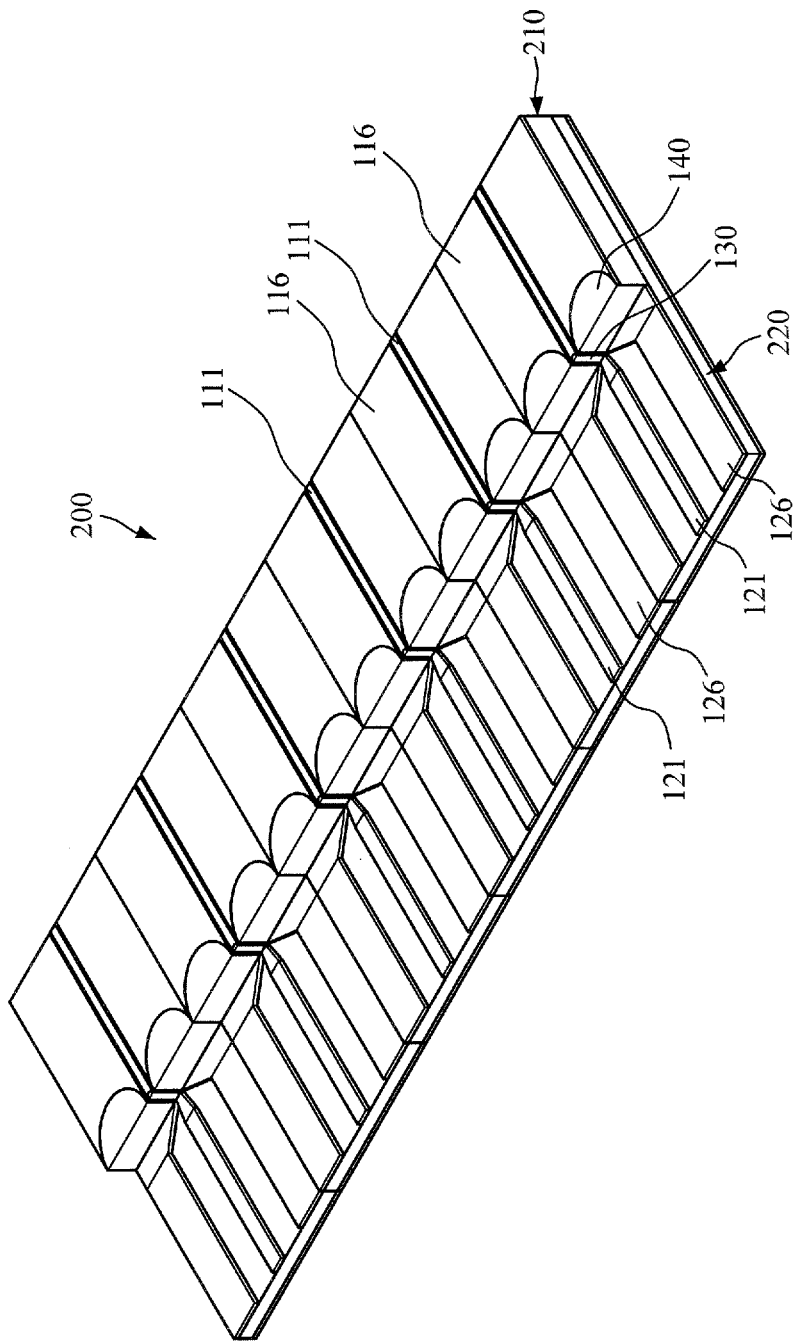
FIG. 8 is a perspective view illustrating an example of a board assembly formed for transmitting numerous high-speed signals.

As illustrated in FIG. 8, a board assembly 200 for transmitting a high-speed signal may be formed so as to transmit numerous high-speed signals. The board assembly 200 may have a plurality of first high-speed signal lines 111 formed on the upper surface of the submount board 210, and a plurality of second high-speed signal lines 121 formed on one part of the upper surface of a base board 220. The first high-speed signal lines 111 may contact, respectively, the second high-speed signal lines 121 by each of the contact members 130 for the signal line. On the upper surface of the submount board 210, first ground lines 116 may be divided into groups of two, and each of the two first ground lines 116 may be disposed on both sides of each of the first high-speed signal lines 111. On one part of the upper surface of the base board 220, the second ground lines 126 may be divided into groups of two, and each of the two second ground lines 126 may be disposed on both sides of each of the second high-speed signal lines 121. The first ground lines 116 may contact, respectively, the second ground lines 126 by each of the contact members 140 for the ground line.

The board assembly 200 for transmitting a high-speed signal according to an exemplary embodiment may gain effects in improving high-speed signal transmission characteristics in comparison to comparison examples of, via a wire-bonding method, connecting a first high-speed signal line 111 and a second high-speed signal line 121, and connecting the first ground line 116 and the second ground line 126.

Figure 9:
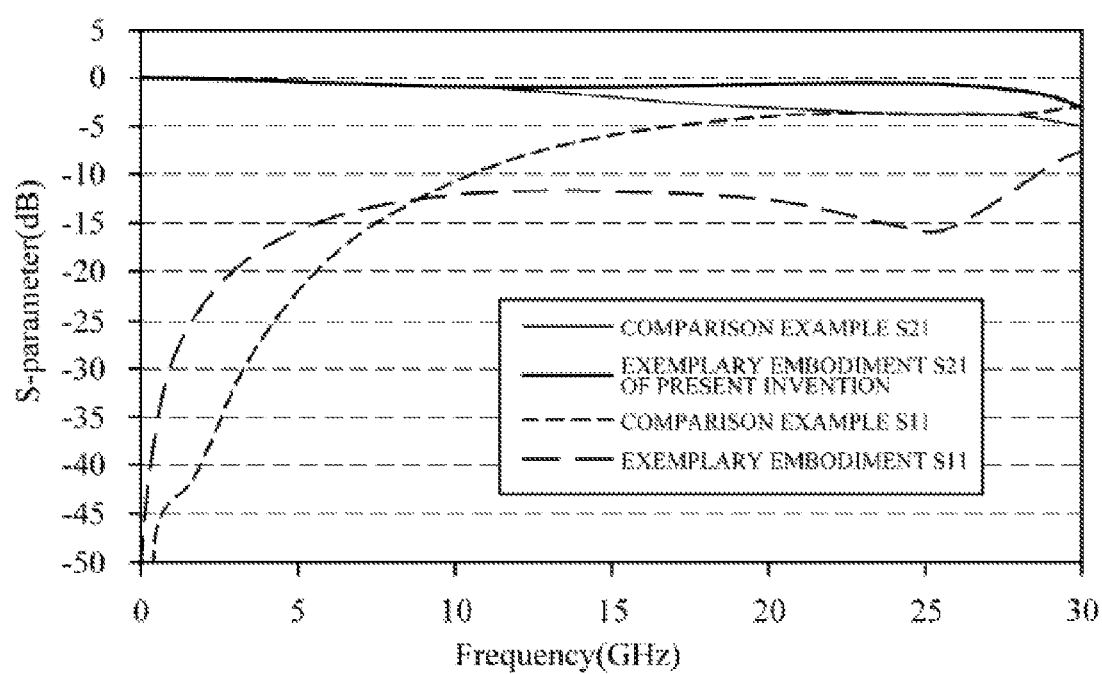
FIG. 9 is a diagram illustrating an example of a comparison result of characteristics on a transmission loss and a return loss of the high-speed signal according to both an exemplary embodiment of the present disclosure illustrated in FIG. 8 and a comparison example.
Figure 10:
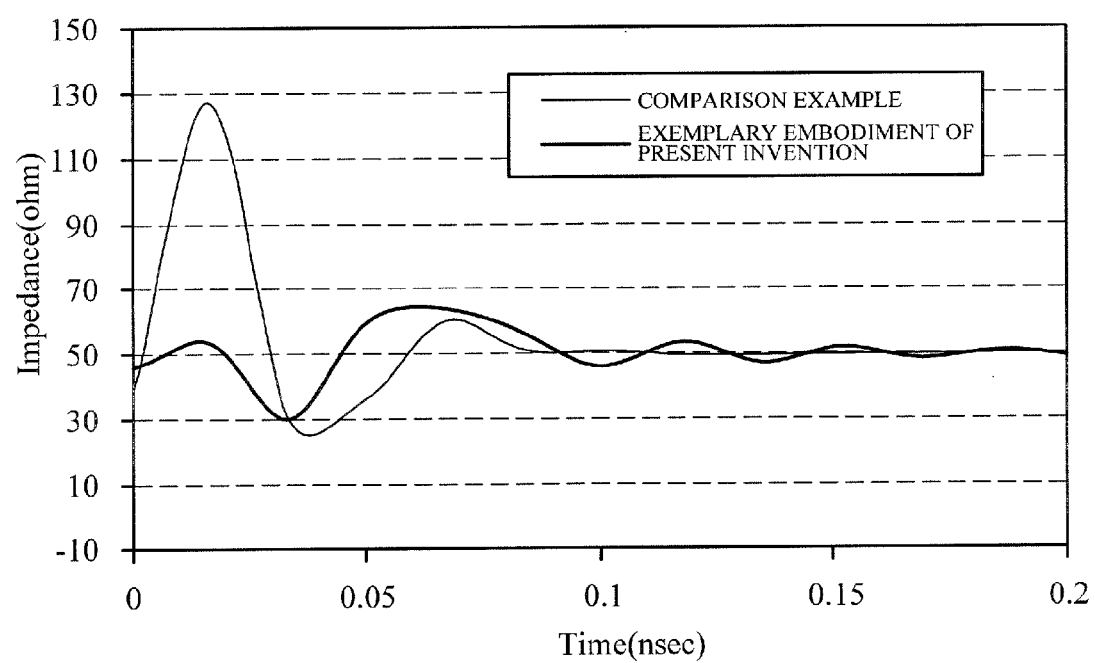
FIG. 10 is a diagram illustrating an example of a comparison result of characteristics on impedance variation according to both an exemplary embodiment of the present disclosure and a comparison example, based on FIG. 9.

Those effects may be shown in graphs illustrated in FIGS. 9 and 10. Here, FIG. 9 is a diagram illustrating an example of a comparison result of characteristics on a transmission loss and a return loss of the high-speed signal according to both an exemplary embodiment of the present disclosure illustrated in FIG. 8 and a comparison example. FIG. 10 is a diagram illustrating an example of a comparison result of characteristics on impedance inflection according to both an exemplary embodiment of the present disclosure and a comparison example, based on FIG. 9.

As illustrated in FIG. 9, an exemplary embodiment shows, at approximately 25 GHz, transmission loss S21 of improved approximately 3 dB and return loss S11 of improved approximately 13 dB. Here, the return loss S11 is a ratio of the incident power to the reflected power. It is desired that the value of return loss S11 is small. The transmission loss S21 is a ratio of the incident power to the transmission power. The transmission power is acquired by subtracting the reflected power from the incident power.

As illustrated in FIG. 10, since the impedance inflection according to the exemplary embodiment of the present disclosure exists between 30 and 70Ω (ohm), the exemplary embodiment of the present disclosure shows a feature of the improved impedance inflection in comparison to the impedance inflection of 28 to 128Ω (ohm) according to the comparison example. Accordingly, it is confirmed that the exemplary embodiment of the present disclosure may improve the high-speed signal transmission characteristics compared to the comparison example.

In addition, according to an exemplary embodiment, problems may be solved, which are the incurred cost by the usage of wire-bonding, the characteristics irregularity between numerous signal lines, the easy removal, the damage of the wire-bonding when using the outermost of a device package, and the like.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A board assembly for transmitting a high-speed signal, comprising:
    a submount board having at least one first high-speed signal line formed on an upper surface thereof;
    a base board having the submount board installed on one part of an upper surface thereof and at least one second high-speed signal line on the other part of the upper surface thereof, wherein each of the at least one second high-speed signal line corresponds to each of the at least one first high-speed signal line; and
    a contact member for a signal line, which is installed on a side of the submount board and has an upper portion contacting the at least one first high-speed signal line and a lower portion contacting the at least one second high-speed signal line such that the at least one first high-speed signal line contacts the at least one second high-speed signal line.

2. The board assembly of claim 1, wherein the contact member for a signal line is inserted to a first semicircular groove formed on a side of the submount board and formed in a shape of a semicircular column with conductivity such that the upper portion of the contact member for a signal line contacts the at least one first high-speed signal line and the lower portion thereof contacts the at least one second high-speed signal line.

3. The board assembly of claim 2, wherein each of the at least one first high-speed signal line and the at least one second high-speed signal line is, respectively, contacted with a same width to the contact member for signal line.

4. The board assembly of claim 1, wherein the submount board comprises at least one first ground line formed on the upper surface thereof, and the base board comprises at least one second ground line formed on the upper surface thereof, wherein each of the at least second ground line corresponds to each of the at least one first ground line.

5. The board assembly of claim 4, further comprising:
    a contact member for a ground line, which is installed on the side of the submount board and have an upper portion contacting the at least one first ground line and a lower portion contacting the at least one second ground line so as to the at least one first ground line contacts the at least one second ground line.

6. The board assembly of claim 5, wherein the contact member for a ground line is inserted into a second semicircular groove formed on a side of the submount board, and is formed in a shape of a semicircular column with conductivity such that an upper portion of the contact member for a ground line contacts the at least one first ground line and the lower portion thereof contacts the at least one second ground line.

7. The board assembly of claim 6, wherein each of the at least one first ground line and the at least one second ground line is, respectively, contacted with a same width to the contact members for a ground line.

8. The board assembly of claim 4, wherein the at least one first ground line is two in number, and each thereof is disposed on both sides of one first high-speed signal line; and
    the at least one second ground line is two in number, and each of the at least one second ground line is disposed on both sides of one of the at least one second high-speed signal line.

9. The board assembly of claim 4, wherein the submount board comprises a first dielectric member in which the at least one first high-speed signal line and the at least one ground line are formed on the upper surface thereof; and
    the base board comprises a second dielectric member in which the at least one second high-speed signal line and the at least one second ground line are formed on the upper surface thereof.

10. A method of manufacturing a board assembly for transmitting a high-speed signal, the method comprising:
    preparing a submount board having at least one first high-speed signal line formed on an upper surface thereof;
    forming at least one first semicircular groove corresponding to the at least one first high-speed signal line on a side of the submount board;
    preparing a contact member for a signal line, which is formed in a shape of a semicircular column being inserted into the at least one first semicircle groove;
    inserting and fixing the contact member for a signal line to the at least one first semicircular groove in such a manner that an upper portion of the contact member for a signal line contacts the at least one first high-speed signal line;
    preparing a base board having at least one second high-speed signal line on a part of an upper surface of the base board, wherein each of the at least one second high-speed signal line corresponds to each of the at least one first high-speed signal line; and
    fixing the submount board to the upper surface of the base board in such a manner that a lower portion of the contact member for a signal line contacts an end of the at least one second high-speed signal line.

11. The method of claim 10, wherein the submount board comprises at least one first ground line on the upper surface thereof, and the base board comprises at least one second ground line on the upper surface thereof, wherein each of the at least one second ground line corresponds to each of the at least one first ground line.

12. The method of claim 11, further comprising:
- forming at least one second semicircular groove corresponding to the at least one first ground line on a side of the submount board;
- preparing a contact member for a ground line formed in a shape of a circular column with conductivity such that the contact member for a ground line is inserted into the at least one second semicircular groove;
- inserting and fixing the contact member for a ground line to the at least one second semicircular groove in such a manner that an upper portion of the contact member for a ground line contacts the at least one first ground line; and
- fixing the submount board to the upper surface of the base board in such a manner that a lower portion of the contact member for a ground line contacts an end of the at least one second ground line.

* * * * *